United States Patent
Val

(10) Patent No.: US 8,136,237 B2
(45) Date of Patent: Mar. 20, 2012

(54) METHOD OF INTERCONNECTING ELECTRONIC WAFERS

(75) Inventor: Christian Val, St Remy les Chevreuse (FR)

(73) Assignee: 3D Plus (FR)

(*) Notice: Subject to any disclaimer, the term of this patent is extended or adjusted under 35 U.S.C. 154(b) by 143 days.

(21) Appl. No.: 12/522,426

(22) PCT Filed: Jan. 28, 2008

(86) PCT No.: PCT/EP2008/050970
§ 371 (c)(1),
(2), (4) Date: Jul. 8, 2009

(87) PCT Pub. No.: WO2008/095811
PCT Pub. Date: Aug. 14, 2008

(65) Prior Publication Data
US 2010/0276081 A1    Nov. 4, 2010

(30) Foreign Application Priority Data
Jan. 30, 2007   (FR) ..................................... 07 00625

(51) Int. Cl.
*H05K 3/36* (2006.01)
(52) U.S. Cl. .............. 29/830; 29/852; 29/853; 174/262; 174/263
(58) Field of Classification Search .............. 29/830, 29/852, 853; 174/262, 263
See application file for complete search history.

(56) References Cited

U.S. PATENT DOCUMENTS

| 4,408,256 | A |   | 10/1983 | Val |
| 4,518,818 | A |   | 5/1985 | Le Ny et al. |
| 4,755,910 | A |   | 7/1988 | Val |
| 5,323,533 | A |   | 6/1994 | Val |
| 5,400,218 | A |   | 3/1995 | Val |
| 5,461,545 | A |   | 10/1995 | Leroy et al. |
| 5,526,230 | A |   | 6/1996 | Val |
| 5,526,563 | A | * | 6/1996 | Tamaki et al. .................. 29/830 |

(Continued)

FOREIGN PATENT DOCUMENTS

EP   0283003   9/1988

(Continued)

OTHER PUBLICATIONS

U.S. Appl. No. 06/089,361, filed Oct. 30, 1979, Christian Val, Abandoned Feb. 27, 1981.

(Continued)

*Primary Examiner* — Carl Arbes
(74) *Attorney, Agent, or Firm* — Lowe Hauptman Ham & Berner, LLP

(57) ABSTRACT

The invention relates to a method of interconnecting electronic components of a first wafer (T1) with electronic components of a second wafer (T2), each wafer having metallized vias (1) which pass through the wafer in the thickness direction. The method includes deposition of a drop (3) of conductive ink containing solvents on each via (1) of the first wafer (T1); stacking of the second wafer (T2) on the first so that the vias (1) of the second wafer (T2) are substantially superposed on the vias (1) of the first wafer (T1); removal of 50 to 90% of the solvents contained in the drops (3) by heating or applying a vacuum, so as to obtain a pasty ink; and laser sintering of the pasty ink drops (3) so as to produce electrical connections (31) between the superposed metallized vias (1).

10 Claims, 4 Drawing Sheets

U.S. PATENT DOCUMENTS

| | | | |
|---|---|---|---|
| 5,637,536 | A | 6/1997 | Val |
| 5,640,760 | A | 6/1997 | Val et al. |
| 5,847,448 | A | 12/1998 | Val et al. |
| 5,885,850 | A | 3/1999 | Val |
| 6,163,957 | A * | 12/2000 | Jiang et al. .................. 29/852 |
| 6,307,261 | B1 | 10/2001 | Val et al. |
| 6,523,250 | B2 * | 2/2003 | Erpelding et al. ......... 29/603.04 |
| 6,716,672 | B2 | 4/2004 | Val |
| 6,809,367 | B2 | 10/2004 | Val |
| 7,476,965 | B2 | 1/2009 | Val et al. |
| 2003/0079680 | A1 | 5/2003 | Fukunaga et al. |
| 2003/0173673 | A1 | 9/2003 | Val |
| 2004/0092099 | A1 | 5/2004 | Hanaoka et al. |
| 2004/0188819 | A1 | 9/2004 | Farnworth et al. |
| 2005/0012188 | A1 | 1/2005 | Val |
| 2005/0098775 | A1 | 5/2005 | Kondo |
| 2005/0104181 | A1 | 5/2005 | Lee et al. |
| 2007/0117369 | A1 | 5/2007 | Val et al. |
| 2008/0170374 | A1 | 7/2008 | Val |
| 2008/0289174 | A1 | 11/2008 | Val |
| 2008/0316727 | A1 | 12/2008 | Val et al. |

FOREIGN PATENT DOCUMENTS

| | | |
|---|---|---|
| EP | 1452326 | 9/2004 |

OTHER PUBLICATIONS

U.S. Appl. No. 06/148,043, filed Feb. 8, 1982, Christian Val, Abandoned Feb. 8, 1982.
U.S. Appl. No. 06/201,870, filed Nov. 3, 1980, Christian Val et al., Abandoned Nov. 9, 1990.
U.S. Appl. No. 06/274,205, filed Jan. 4, 1984, Jacques Le Ny et al., Abandoned Dec. 2, 1983.
U.S. Appl. No. 06/296,650, filed Aug. 27, 1981, Christian Val, Abandoned Jan. 4, 1984.
U.S. Appl. No. 07/030,854, filed May 12, 1987, Christian Val, Abandoned Aug. 1, 1988.
U.S. Appl. No. 07/226,512, filed Apr. 1, 1988, Christian Val, Abandoned Nov. 15, 1989.
U.S. Appl. No. 06/920,073, filed Oct. 16, 1986, Christian Val, Abandoned Sep. 22, 1989.
U.S. Appl. No. 07/026,228, filed Jan. 29, 1987, Christian Val, Abandoned Apr. 2, 1996.
U.S. Appl. No. 07/844,631, filed Aug. 23, 1991, Michel Leroy et al., Abandoned Sep. 13, 1994.
U.S. Appl. No. 07/920,482, filed Dec. 6, 1991, Michel Leroy et al., Abandoned Aug. 12, 1994.
U.S. Appl. No. 08/289,855, filed Aug. 12, 1994, Michel Leroy, Abandoned Nov. 15, 1996.
U.S. Appl. No. 08/604,752, filed Feb. 23, 1996, Christian Val, Abandoned Jun. 12, 1998.
U.S. Appl. No. 08/351,407, filed Apr. 15, 1994, Christian Val, Abandoned Sep. 4, 1996.
U.S. Appl. No. 06/089,361, filed Oct. 30, 1979.
U.S. Appl. No. 06/148,043, filed Feb. 8, 1982.
U.S. Appl. No. 06/201,870, filed Nov. 3, 1980.
U.S. Appl. No. 06/274,205, filed Jan. 4, 1984.
U.S. Appl. No. 06/296,650, filed Aug. 27, 1981.
U.S. Appl. No. 07/030,854, filed May 12, 1987.
U.S. Appl. No. 07/226,512, filed Apr. 1, 1988.
U.S. Appl. No. 06/920,073, filed Oct. 16, 1986.
U.S. Appl. No. 07/026,228, filed Jan. 29, 1987.
U.S. Appl. No. 07/844,631, filed Aug. 23, 1991.
U.S. Appl. No. 07/920,482, filed Dec. 6, 1991.
U.S. Appl. No. 08/289,855, filed Aug. 12, 1994.
U.S. Appl. No. 08/604,752, filed Feb. 23, 1996.
U.S. Appl. No. 08/351,407, filed Apr. 15, 1994.
U.S. Appl. No. 12/438,179, filed Aug. 3, 2007, Christian Val.
U.S. Appl. No. 12/258,060, filed Oct. 24, 2008.

* cited by examiner

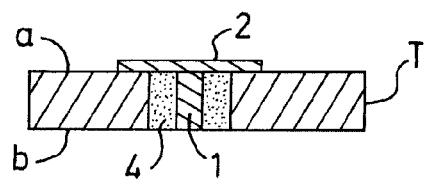
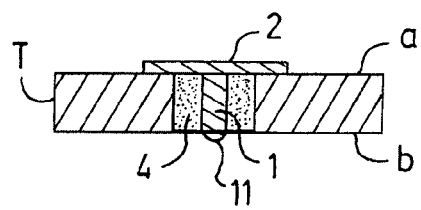
FIG.1a    FIG.1b
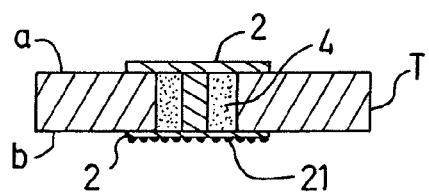
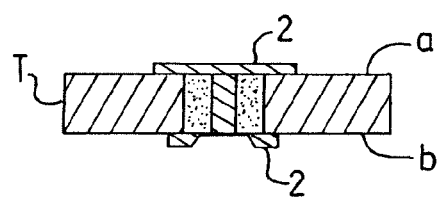
FIG.1c    FIG.1d
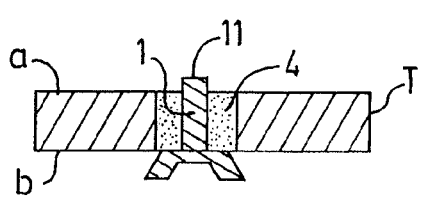
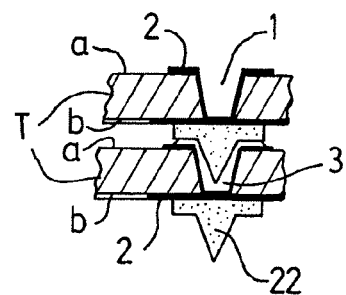
FIG.1e    FIG.1f

METHOD OF INTERCONNECTING ELECTRONIC WAFERS

CROSS-REFERENCE TO RELATED APPLICATIONS

The present application is based on International Application No. PCT/EP2008/050970, filed on Jan. 28, 2008, which in turn corresponds to French Application No. 07 00625, filed on Jan. 30, 2007, and priority is hereby claimed under 35 USC §119 based on these applications. Each of these applications are hereby incorporated by reference in their entirety into the present application.

FIELD OF THE INVENTION

The field of the invention is that of the interconnection of 3D electronic modules and more precisely the vertical interconnection thereof.

BACKGROUND OF THE INVENTION

A 3D electronic module is a stack of heterogeneous electronic components. The term "heterogeneous component" is understood to mean an electronic component comprising at the same time one or more active and/or passive components connected together and thus forming an electronic circuit ensuring a given electronic function. The active component comprises any component usually called a "chip" and employing semiconductor technology; it may for example be a diode, a transistor, an integrated circuit, a dedicated ASIC circuit, a memory or a microprocessor. The term "passive component" is understood to mean the other components, whether these be conventional surface-mounted components of the resistor, capacitor or inductor type, or electromechanical components etched into the silicon and known as MEMS (microelectromechanical systems).

The term "vertical interconnection" is understood to mean interconnection in the stacking direction.

There are many techniques for interconnecting 3D electronic modules, which may be divided into two families:
  interconnection and stacking of heterogeneous components;
  interconnection and stacking of silicon wafers each comprising a multitude of identical heterogeneous components.

The invention relates to the vertical interconnection of such wafers.

According to a known technique, these wafers are interconnected by means of vias, i.e. holes passing through the wafer in its thickness direction, which are electrically isolated therefrom and then metallized. The components are connected to the vias. The interconnection of metallized vias is tricky, and is based on the following methods:
  thermocompression bonding;
  solder alloy reflow;
  etc.
  In general, these methods require:
  high-temperature treatments and/or pressure on each interconnect which damage a not insignificant number of components;
  extremely precise alignments difficult to achieve; and
  very good flatness, as all the vias must be contacted.
In addition, the 3D modules obtained are individually checked, but the quality of the interconnects is not.

SUMMARY OF THE INVENTION

The aim of the invention is to substantially overcome these drawbacks.

The invention is based on interconnection by the sintering of silver nanoparticles present in an ink deposited on vias.

More precisely, the subject of the invention is a method of interconnecting electronic components of a first wafer with electronic components of a second wafer. Each wafer has metallized vias which pass through the wafer in the thickness direction. A drop of conductive ink containing solvents is deposited on each via of the first wafer. The second wafer is stacked on the first so that the vias of the second wafer are substantially superposed on the vias of the first wafer. 50 to 90% of the solvents contained in the drops are removed by heating or applying a vacuum, so as to obtain a pasty ink. The pasty ink drops are laser sintered so as to produce electrical connections between the superposed metallized vias.

According to one feature of the invention, it includes an additional step of checking at least one electrical connection by means of an integrated laser diode.

The first wafer is optionally a wafer connected beforehand to at least one other wafer.

The conductive ink typically comprises nanoparticles of a metal such as Ag or Cu or Au.

Still other objects and advantages of the present invention will become readily apparent to those skilled in the art from the following detailed description, wherein the preferred embodiments of the invention are shown and described, simply by way of illustration of the best mode contemplated of carrying out the invention. As will be realized, the invention is capable of other and different embodiments, and its several details are capable of modifications in various obvious aspects, all without departing from the invention. Accordingly, the drawings and description thereof are to be regarded as illustrative in nature, and not as restrictive.

BRIEF DESCRIPTION OF THE DRAWINGS

The present invention is illustrated by way of example, and not by limitation, in the figures of the accompanying drawings, wherein elements having the same reference numeral designations represent like elements throughout and wherein:

FIGS. 1a, 1b, 1c, 1d, 1e and 1f schematically show cross-sectional views of various embodiments of vias;

DETAILED DESCRIPTION OF THE INVENTION

Figure 2A:
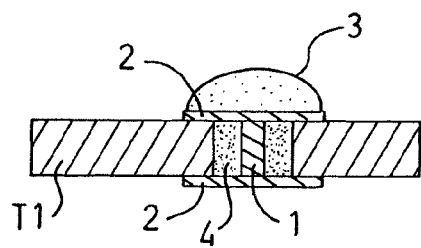
FIGS. 2a, 2a', 2b, 2b', 2c, 2c', 2d, 2d', 2e and 2e' schematically illustrate cross-sectional views of various steps in the interconnection method according to the invention.
Figure 2A:
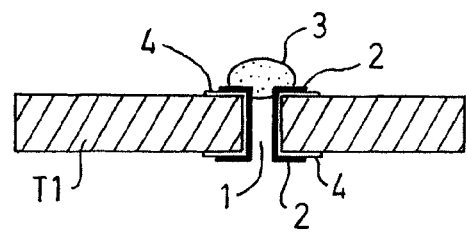

The invention relates to the vertical interconnection of wafers provided with metallized vias, each wafer comprising a multitude of identical heterogeneous components electrically connected to one another and/or to these vias. A wafer typically has a thickness of 10 to 200 µm.

Several embodiments of vias are envisioned, these being described in relation to FIG. 1. The metal of the vias is for example copper or gold and it may cover only the walls of the vias, or may fill them so as to form a pillar. Typically, a via has a diameter of 2 to 50 µm. Each via 1 is electrically isolated from the silicon wafer T by an electrical insulator 4 such as $SiO_2$, as shown in FIG. 1a. A protuberance 11 may be produced on one end of a pillar 1 (cf. FIG. 1b). An electrically conductive protruding bump may also be grown on a pillar. According to one embodiment, an electrically conductive collar 2, for example made of copper, surrounds the via 1 on one or both faces (a, b) of the wafer T. Optionally, the collar 2 forms a full disk largely centered on the via; these two forms of collars are illustrated in FIG. 1d, the disk-forming collar being placed on face a. The collar 2 may be provided with microbumps 21 or with a large bump 22, these being electrically conductive, for example made of gold, and shown in FIG. 1c and FIG. 1f respectively.

The various steps of the method according to the invention will now be described in relation to FIGS. 2 and 2'. The vias 1 shown in FIGS. 2 and 3 are pillars, and disks 2 are placed on the vias on both faces a and b of each wafer. In FIGS. 2' and 3' the metal of the vias 1 covers only the walls, and collars 2 are placed around these vias on both faces a and b of each wafer.

Figure 3:
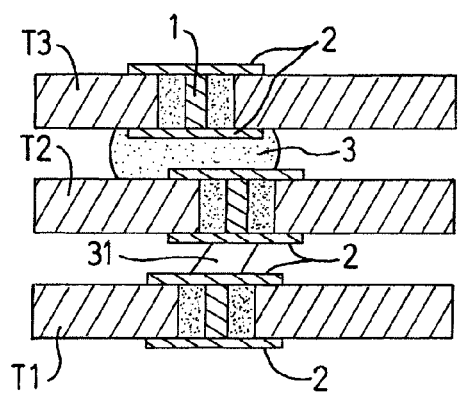
FIGS. 3 and 3' illustrate a cross-sectional view of one of the steps for interconnecting a stack of three wafers according to the invention.
Figure 3:
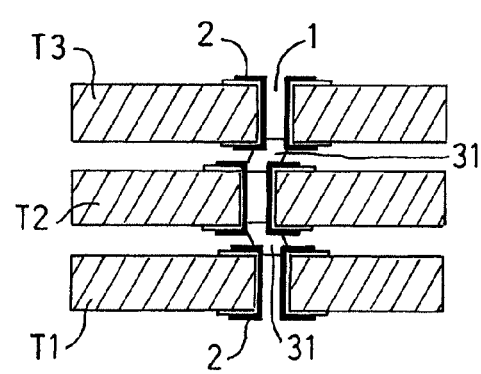

A drop 3 of conductive ink between 1 and 20 µm in thickness is deposited on each via 1 of a first wafer T1, this drop being centered by the optional collar or substantially covering the latter when it is a disk, as illustrated in FIGS. 2a' and 2a. The purpose of the optional bumps or protuberances 11, 21 or 22 shown in FIG. 1 is to strengthen the points of contact with the ink drop 3. The protuberance 11 of the pillar and the protuberant bump 22 are also intended to fit into the cavity bounded by the collar 2, or into a hollow via 1 matched to the geometry of the bump as illustrated in FIG. 1f. This ink comprises metal nanoparticles embedded in a solvent, the metal typically being silver, copper or gold. These drops 3 are for example deposited by ink jet by means of a nozzle using a drop-on-demand method, or by screen printing. They may be deposited locally on the vias or on the collars thereof.

A second wafer T2 is stacked on the first, so that the vias 1 of the second wafer are perfectly or virtually superposed on those of the first. This can be seen in FIGS. 2b and 2b'. After such stacking, the ink drop 3 may be slightly shifted from its original position.

The solvents contained in the ink drop are partially removed by heating in an oven at a temperature below 100° C. or in a vacuum by creating an underpressure of between 100 and 200 mbar. The purpose of this solvent removal, illustrated by the arrows 33 in FIGS. 2c and 2c', is to remove 50 to 90% thereof so as to obtain a pasty ink.

Figure 2B:
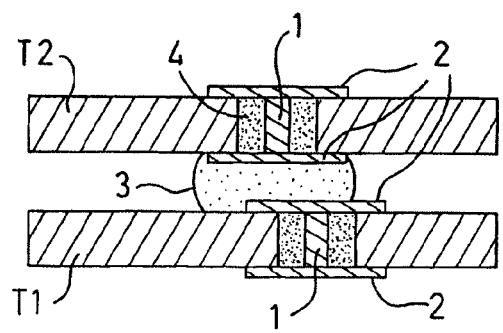
Figure 2B:
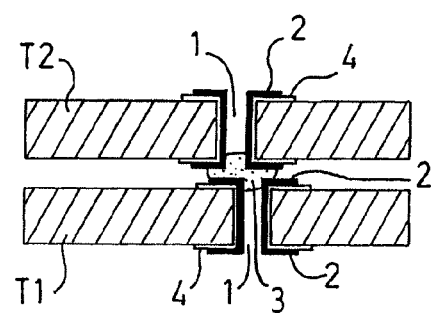
Figure 2C:
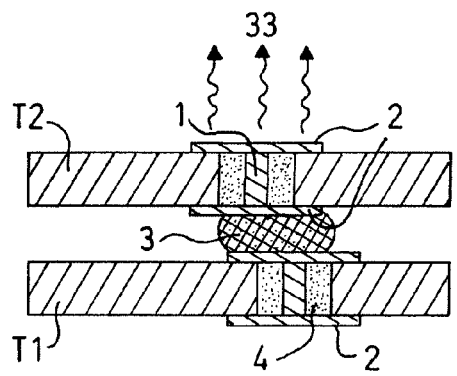
Figure 2C:
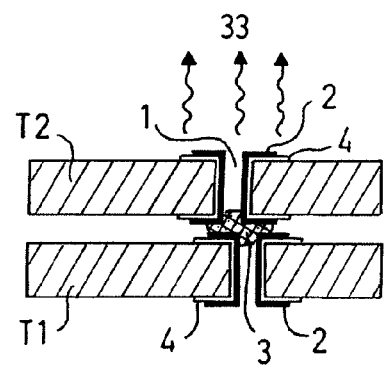
Figure 2D:
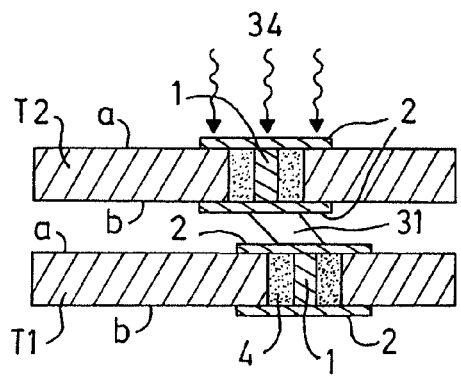
Figure 2D:
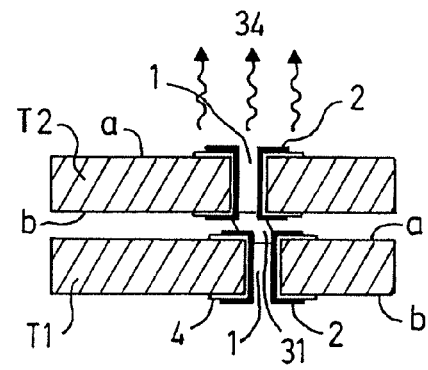
Figure 2E:
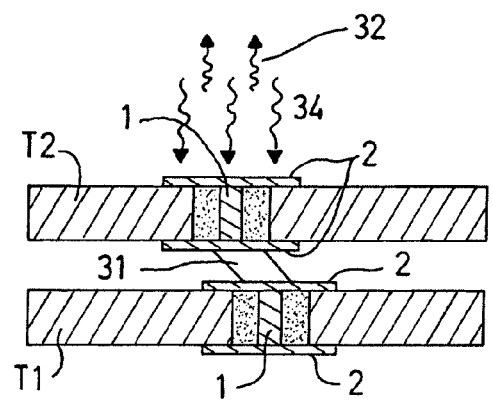
Figure 2E:
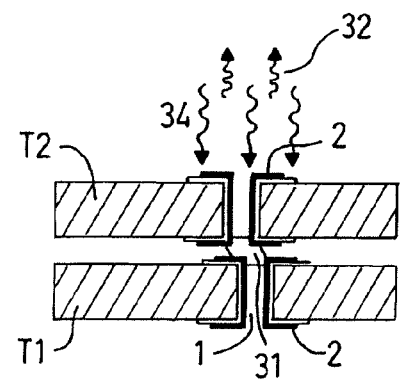

Referring to FIGS. 2d and 2d', the next step is to sinter the conductive drops 3, obtained by supply of energy 34. Sintering is the consolidation of a material, obtained by a supply of energy, without going as far as melting it. In this case, the material is said ink comprising silver nanoparticles. Under the effect of this energy, the nanoparticles are welded together, and thus form a mechanical and electrical connection. This supply of energy 34 is preferably a localized supply of energy at the vias 1, obtained for example by means of a pulsed laser, such as a YAG or $CO_2$ laser emitting pulses of duration of the order of a few ns at a pulse repetition frequency of between 1 and 50 kHz. It is also possible to carry out overall heating of the drops by placing the stacked wafers in a reducing or nonoxidizing atmosphere, typically comprising a forming gas, this being a hydrogen/nitrogen mixture.

The heat 34, which is mainly directed onto the upper face a of the wafer T2, diffuses into the metallized central pillar of the via 1 which channels this heat and conducts it to the disk 2 on the lower face b of the wafer T2. This disk 2, which is in contact with the ink drop 3, conducts the heat into this drop, which is also in contact (possibly in partial contact) with the disk 2 of the upper face a of the first wafer T1. The heat serves to sinter the silver particles between the lower disk 2 of the second wafer T2 and the upper disk 2 of the first wafer T1, even if these disks are not perfectly superposed as illustrated in the figures. An electrical connection 31 is thus made between the vias 1 of the first and second wafers T1, T2.

Next, it is preferred to carry out a step of checking the connection 31 between the two wafers T1, T2 (cf. FIGS. 2e and 2e'), although this step is not essential: it is advantageously carried out by analyzing the thermal signature of this connection. This is because the thermal transmission between the upper disk 2 (face a) of the first wafer T1 and the lower disk 2 (face b) of the second wafer T2, and therefore the signature, is completely different depending on whether or not the connection exists. This signature is advantageously analyzed by the laser used for the sintering, the laser then being equipped with a diode for analyzing the signal 32 returned by the disk 2 of the upper wafer T2.

After having stacked and connected two wafers T1, T2, the method may be repeated so as to connect a third wafer T3 to the upper wafer T2 of the already connected stack, and so on so as to obtain a stack of n wafers, where n>3. The step of stacking the wafer T3 after ink drops have been deposited on the wafer T2, corresponding to the step shown in FIG. 2b, is shown in FIG. 3, and the stack of the three wafers connected according to the method is shown in FIG. 3'. As a variant, k wafers (k>2) on which ink drops have been deposited are stacked. The steps of partially evaporating the solvents, of sintering the drops and optionally of checking the connections are then applied to the stack.

It will be readily seen by one of ordinary skill in the art that the present invention fulfils all of the objects set forth above. After reading the foregoing specification, one of ordinary skill in the art will be able to affect various changes, substitutions of equivalents and various aspects of the invention as broadly disclosed herein. It is therefore intended that the protection granted hereon be limited only by definition contained in the appended claims and equivalents thereof.

The invention claimed is:

1. A method of interconnecting electronic components of a first wafer with electronic components of a second wafer, each wafer having metallized vias which pass through the wafer in a thickness direction of said wafer, said method comprising the following steps:
  depositing a drop of conductive ink containing solvents on each of the metallized vias of the first wafer;
  stacking the second wafer on the first wafer so that the vias of the second wafer are substantially superposed on the vias of the first wafer;
  removing 50 to 90% of the solvents contained in the drops between the first and second wafers by heating or applying a vacuum, so as to obtain a pasty ink; and
  laser sintering the pasty ink drops so as to produce electrical connections between the superposed metallized vias.

2. The method as claimed in claim 1, further comprising checking at least said one electrical connection by means of an integrated laser diode.

3. The method as claimed in claim 1, further comprising connecting the first wafer beforehand to at least one other wafer.

4. The method as claimed in claim 1, wherein the conductive ink comprises nanoparticles of a metal including Ag or Cu or Au.

5. The method as claimed in claim 1, wherein the drops are deposited by an ink jet or by screen printing.

6. The method as claimed in claim 1, wherein the metallized vias have metal which fills the vias and thus forms pillars.

7. The method as claimed in claim 6, wherein one of said pillars is extended by a protuberance.

8. The method as claimed in claim 1, wherein, said first or second wafer has two faces, an electrically conductive collar surrounds the respective metallized via on said one or both faces of flail said wafer, and the drop deposited on the via is in contact with said electrically conductive collar.

9. The method as claimed in claim 8, wherein the collar forms a full disk largely centered on the via.

10. The method as claimed in claim 8, wherein at least one collar is provided with bumps.

* * * * *